United States Patent [19]

Lee

[11] Patent Number: 5,259,794
[45] Date of Patent: Nov. 9, 1993

[54] METAL CLIP FOR ELECTRICAL CONNECTOR

[76] Inventor: Chia-Ta Lee, Suite 1, 11F, 95-8 Chang Ping Road, Sec. 1, Taichung, Taiwan

[21] Appl. No.: 184

[22] Filed: Jan. 4, 1993

[51] Int. Cl.⁵ .......................................... H01R 13/41
[52] U.S. Cl. ...................................... 439/751; 439/69
[58] Field of Search ................. 439/68, 69, 70, 751, 439/842, 857, 858

[56] References Cited

U.S. PATENT DOCUMENTS 4,192,565  3/1980  Gianni ................................. 439/69
4,552,422  11/1985  Bennett et al. ..................... 439/69

Primary Examiner—Eugene F. Desmond

[57] ABSTRACT

An electrical connector for connecting a central processing unit chip to a computer circuit board comprises a plurality of metal clips forcibly insertedly disposed within a plurality of socket holes formed on a connector body. Each of the metal clips comprises a base which is formed by bending a plate member to form a hollow tubular member on the top of which a pinching member which is also a hollow tubular member is integrally formed. An elongated flat peg extends downward from the bottom of the base to insert into a hole formed on a circuit board. The socket holes comprise a lower holding portion substantially complemental in shape to, but smaller in size than the base of the metal clip in order to forcibly receive therein the base of the metal clip. The socket holes also have an upper portion corresponding to the pinching member of the metal clip to receive therein the pinching member. A vertical slit is provided on the hollow tubular base to accommodate the thermal deformation thereof and a plurality of vertical slits are provided on the lower tapering end of the tubular pinching member to provide a better resilience for frictionally engaging with the pins of a CPU chip. On the flat peg, a reinforcing rib is formed by pressing to formed an elongated indentation.

9 Claims, 2 Drawing Sheets

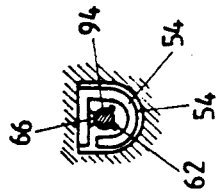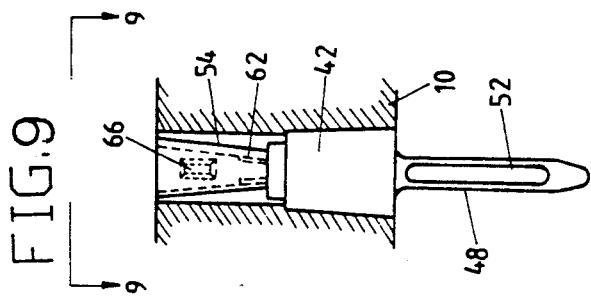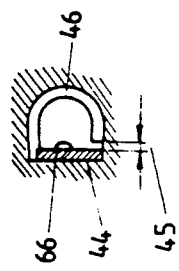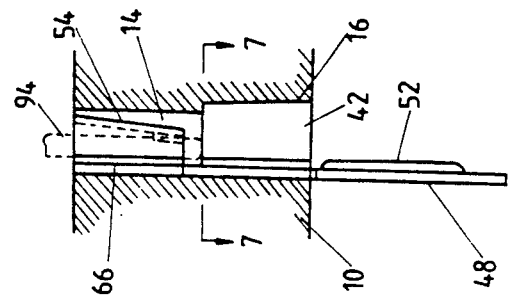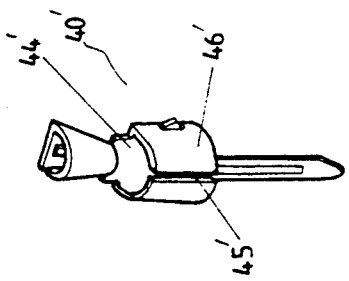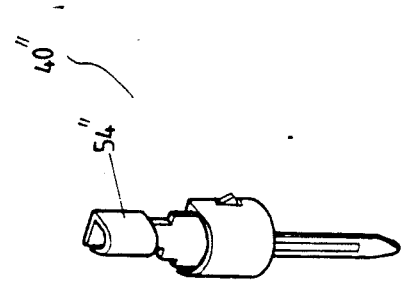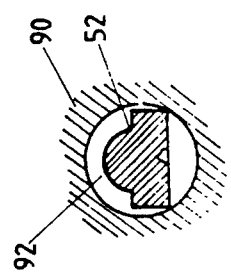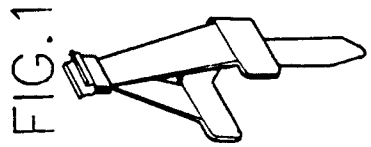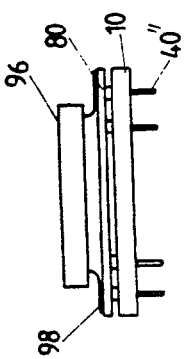

METAL CLIP FOR ELECTRICAL CONNECTOR

FIELD OF THE INVENTION

The present invention relates generally to an electrical connector for connecting an integrated circuit (IC) chip to a printed circuit board, especially for connecting a central processing unit (CPU) chip of a personal computer (PC) to a printed circuit board thereof, and in particular to a conductive clip structure which is embedded in the electrical connector for securely receiving therein a pin of the CPU chip.

BACKGROUND OF THE INVENTION

Conventional CPU chip connector comprises a plurality of metal clips respectively forcibly insertedly disposed in a plurality of socket holes formed on the connector body to hold the pins of a CPU chip so as to electrically connect the CPU chip to a circuit board. As shown in FIG. 14 of the attached drawings, the conventional metal clip has two resilient legs forming a pinching area for resiliently hold a chip pin inserted therebetween. The two resilient legs are integrally formed on a base which is in turn secured inside one of the socket holes of the conventional connector.

One disadvantage of the prior art metal clip shown in FIG. 14 is that when the computer which has a CPU connected to its circuit board with the prior art connector has been operated for quite some time, the temperature thereof will rise and the high temperature will be transmitted to the metal clip. Due to the thermal expansion thereof, the metal clips may not be maintained in a given tolerance so that it is difficult for the CPU pins to be inserted or maintained therein. Further, due to the difference in thermal expansion between the metal clip and the connector body, the socket holes of the connector may not be able to hold the metal clips securely and thus leading in a failure in electrical connection or an accidental loosening of the metal clips from the connector body.

Besides, as can be observed from FIG. 14, the prior art metal clip forms the pinching area with two opposing flat portions. This may result in a poor electrical contact with the CPU chip pins which are generally circular in cross section.

It is therefore desirable to provide an improved electrical connector of the above-mentioned type for the connection of a CPU chip to a computer circuit board which overcomes the deficiencies of the prior art connector.

OBJECTS OF THE INVENTION

It is an object of the present invention to provide an electrical connector which has a plurality of metal clips respectively disposed within a plurality socket holes formed on a connector body thereof, wherein each of the metal clips comprises a base formed by bending a piece of metal plate to provide a hollow tubular member which has a vertical slit thereon to accommodate the thermal expansion thereof so that the metal clips is maintained securely held by the socket holes even after a long term operation.

It is another object of the present invention to provide an electrical connector which has a plurality of metal clips respectively disposed within a plurality socket holes formed on a connector body thereof, wherein each of the metal clips comprises a pinching member integrally formed on the top end of the base, which is formed by bending a plate member to form a hollow tubular member having a tapering lower end with a plurality of vertical slits thereon to increase the resilient pinching capability thereof for holding a CPU pin therein, tapering lower end having an inner cross-sectional dimension less than the diameter of the chip pin so that when the pin is inserted therein, the vertical slits resiliently flaring outward to provide means for accommodating the insertion of the chip pin.

It is also an object of the present invention to provide an electrical connector which has a plurality of metal clips respectively disposed within a plurality socket holes formed on a connector body thereof, wherein each of the metal clips comprises an elongated, flat connecting peg which extends downward from the lower side of the base to insert into holes formed on the circuit board, the flat peg extension comprising a vertical rib which is an elongated indentation formed by pressing the peg extension in order to strengthen the peg extension and, due to the enlarged cross-sectional area provided by the rib, to provide a better prevention of the melted soldering material from splashing upward through the holes of the circuit board and thus contaminating the circuit board.

To achieve the above-mentioned objects, there is provided an electrical connector comprising a plurality of metal clips forcibly insertedly disposed within a plurality of socket holes formed on a connector body. Each of the metal clips comprises a base which is formed by bending a plate member to form a hollow tubular member on the top of which a pinching member which is also a hollow tubular member is integrally formed. An elongated flat peg extends downward from the bottom of the base to insert into a hole formed on a circuit board. The socket holes comprise a lower holding portion substantially complemental in shape to, but smaller in size than the base of the metal clip in order to forcibly receive therein the base of the metal clip. The socket holes also have an upper portion corresponding to the pinching member of the metal clip to receive therein the pinching member. A vertical slit is provided on the hollow tubular base to accommodate the thermal deformation thereof and a plurality of vertical slits are provided on the lower tapering end of the tubular pinching member to provide a better resilience for frictionally engaging with the pins of a CPU chip. On the flat peg, a reinforcing rib is formed by pressing to formed an elongated indentation.

Other objects and advantages of the invention will be apparent from the following description of preferred embodiments taken inconnection with the accompanying drawings wherein:

BRIEF DESCRIPTION OF THE DRAWINGS

FIG. 6 is a cross-sectional view taken along the same direction as FIG. 4 with the metal clip of FIG. 2 disposed therein and a CPU chip pin inserted into the metal clip to show the securing of the chip pin in the pinching member of the metal clip of the present invention;

FIG. 7 is a cross-sectional view taken along line 7—7 of FIG. 6;

FIG. 8 is a cross-sectional view taken along the same direction as FIG. 5 with the metal clip shown in FIG. 2 disposed therein to show the disposition of the metal clip of the present invention in the socket hole of the connector, the CPU chip pin shown in FIG. 6 being removed for a better illustration of the metal clip in the socket hole;

FIG. 9 is a top plan view taken along line 9—9 of FIG. 8;

FIG. 10 is a cross-sectional view showing the elongated flat peg of the metal clip of FIG. 2 inserted into a pin hole formed on a circuit board;

FIG. 11 is a perspective view showing a second embodiment of the metal clip made in accordance with the present invention suitable for use in a PGA type CPU;

FIG. 12 is a perspective view showing a third embodiment of the metal clip made in accordance with the present invention suitable for use in an SMT type CPU;

FIG. 13 is a side elevational view showing the connection of an SMT CPU to the electrical connector of the present invention with an adaptor; and FIG. 14 is a perspective view showing a prior art metal clip for use in a conventional connector to connect a PGA type CPU to a circuit board.

DETAILED DESCRIPTION OF THE PREFERRED EMBODIMENT

Figure 1:
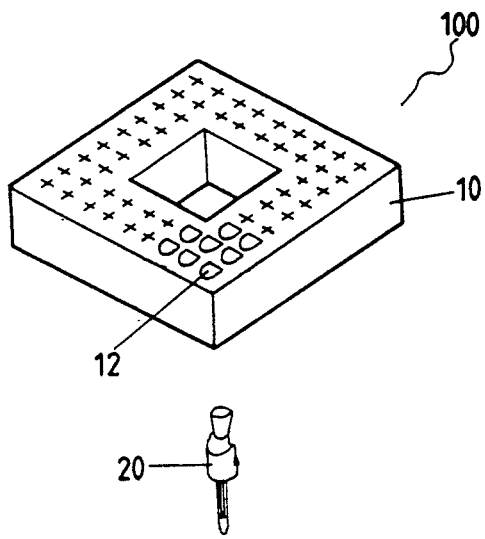
FIG. 1 is a perspective view showing an electrical connector with a metal clip of the present invention disassembled therefrom to show the relationship therebetween.
Figure 2:
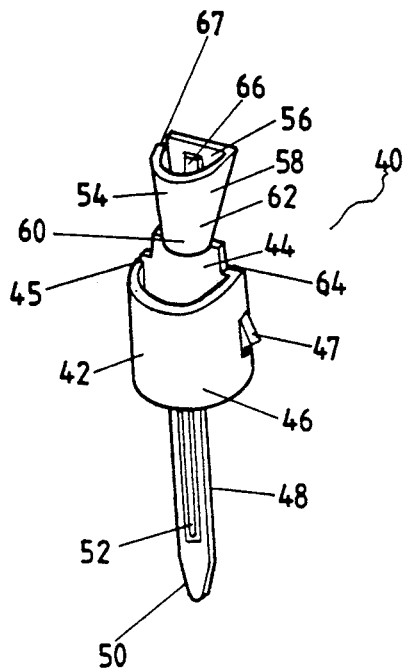
FIG. 2 is a perspective view showing a first embodiment of a metal clip made in accordance with the present invention suitable for use in a PGA type CPU.
Figure 3:
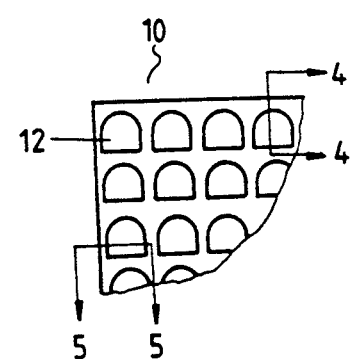
FIG. 3 is a partial top plan view showing a portion of the electrical connector shown in FIG. 1.

With reference to the drawings and in particular to FIGS. 1-9, wherein an electrical connector for connecting a PGA type CPU chip (not shown) to a circuit board 90 (see FIG. 10) made in accordance with the present, generally designated with reference numeral 100, is shown, the electrical connector 100 comprises a connector body 10, generally having a square or rectangular shape as illustrated in FIG. 1, on which a plurality of socket holes 12 are formed. The socket holes 12 are best illustrated in FIG. 3. Inside each of the socket holes 12, a conductive clip in accordance with the present invention, generally designated with the reference numeral 40 and best illustrated in FIG. 2, is forcibly inserted and thus securely held therein, as shown in FIGS. 6-9. Preferably, the conductive clips 40 are made of a resilient metal.

Figure 4:
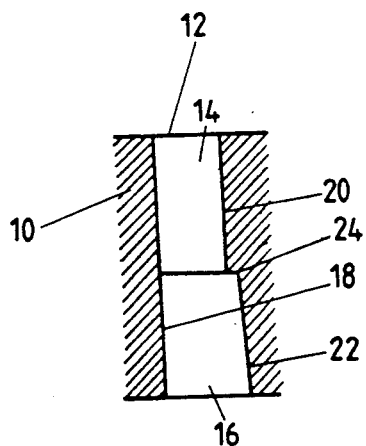
FIG. 4 is a cross-sectional view taken along line 4—4 of FIG. 3.
Figure 5:
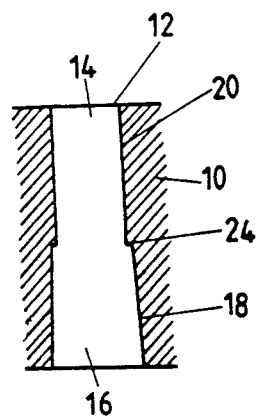
FIG. 5 is a cross-sectional view taken along line 5—5 of FIG. 3.

With particular reference to FIGS. 4 and 5, which are cross-sectional views of the socket holes 12 taken in othorgonal directions, each of the socket holes 12 comprises an upper section 14 and a lower section 16. The socket hole 12 has a flat side wall 18 which extends through the lower section 16 and the upper section 14. The upper section 14 comprises a semi-cylindrical side wall 20 which, together with a portion of the flat side wall 18, defines the upper section 14 of the socket hole 12. The lower section 16 comprises a semi-conical side wall 22 which, together with a portion of the flat side wall 18, defines the lower section 16 of the socket hole 12.

The semi-conical lower section 18 comprises a narrow end having a cross-sectional dimension larger than the upper section 14 connected to an end of the semi-cylindrical upper section 14 to define a shoulder 24. The semi-conical lower section 18 also comprises a wide opening opened to the underside of the connector body 10 and the semi-cylindrical upper section 14 also has another end opened to the upper surface of the connector body 10 so as to form a hole through the connector body 10 with a wider opening on the underside thereof for receiving therein the metal clip 40.

The shoulder 24 serves as a stop to constrain the upward movement of the metal clip 40.

With reference to FIG. 2, the metal clip 40 comprises a base 42 substantially complemental in shape to but slightly larger in diametrical direction than the lower section 16 of the socket hole 12 so that when the metal clip 40 is inserted into the socket hole 12 from the lower wider opening thereof, the base 42 is forcibly fit into the lower section 16 of the socket hole 16.

In manufacturing, the base 42 is formed by bending a lateral extension of a plate-like flat member 44 to form a length of a hollow tubular member having the shape corresponding to the semi-conical lower section 16 with a vertical gap or slot 45 of a suitable width X left between the flat portion 44 and the semi-conical portion 46 thereof. With such a vertical gap 45, the semi-conical portion 46 are more capable to deform when acted upon by external force, including the resistant force generated by the semi-conical side wall 22 against the force fitting of the base 42 into the lower section 16 of the socket hole 12 and the force induced by thermal expansion of the base 42.

The base 42 of the metal clip 40 may comprises a plurality of sideway paw members 47 (only one shown in the drawings) pointing downwards to engage the side wall of the socket hole 12 so as to help preventing the metal clip 40 from disengaging from the socket hole 12.

On the lower end of the base 42 of the metal clip 40, an elongated flat peg 48 is formed. The flat peg 48 is an integral extension of the flat portion 44 of the base 42 and has a sharpened lower end 50 to insert into a hole 92 formed on the circuit board 90 (see FIG. 10) to be soldered there.

The flat peg 48 comprises a vertical reinforcing rib 52 (also see FIG. 10) formed along a portion of the length thereof to strengthen the flat peg 48. Preferably, the rib 52 is formed by pressing the flat peg 48 to form an elongated indentation. The rib 52 also has another function, i.e. to provide a better prevention of the melted soldering material from splashing upward through the hole 92 to contaminate the circuit board 90. This is due to the fact that by forming the indented rib 52, the cross-sectional area of the flat peg 48 is substantially increased so as to occupy more space within the hole 92.

On the top end of the base 42 of the metal clip 40, a pinching member 54 is formed. The pinching member 54, similar to the base 42, is a length of a hollow tubular member comprising a flat portion 56 which is an integral extension of the flat portion 44 of the base 42 and a curved portion 58. The curve portion 58 of the pinching member 54 is substantially in the form of a semi-cylinder of substantially the same diametrical dimension to be loosely fit into the semi-cylindrical upper section 14 of the socket hole 12. However, the semi-cylindrical portion 58 has a tapering lower end 60 on which a plurality of vertical slits 62 are formed to extend from the tapering low end 60 upwards to a suitable location.

In manufacturing, the pinching member 54 is preferably made by bending a lateral extension of an upper extending portion of the plate-like member used to form the base 42.

A vertical slot 67 which has the same function as the vertical slot 45 formed on the base 42 is provided on the pinching member 54, preferably between the flat portion 56 and semi-cylindrical portion 58 thereof.

The semi-cylindrical portion 58 of the pinching member 54 is separated from the semi-conical portion 46 of the base 42 and a step 64 is formed on the flat portion 44 of the base 42 at the connection with the flat portion 56 of the pinching member 54 to abut against the should 24 of the socket hole 12 so as to constrain the upward movement of the metal clip 40.

The inside cross-sectional dimension of the lower tapering end 60 of the hollow tubular pinching member 54 is substantially less than the diameter of the pins 94 (see FIG. 6) of the CPU chip so that when the pin 94 is inserted into the hollow pinching member 54, the slit lower tapering end 60 of the pinching member 54 slightly flare outward to accommodate the pin 94 therein and securely pinch the pin 94 by the restoring resilient force thereof.

Preferably, an inward projection 66 is formed on the flat portion 56 of the pinching member 54 to reduce the inside dimension of the hollow tubular pinching member 54 so to help maintaining or pinching the chip pin 94 therein.

It can be understood to those skilled in the art that it is not essential for the location of the vertical gap 45 of the embodiment of the metal clip 40 shown in FIG. 2 to be exactly as that shown in FIGS. 2 or 7. For example, in FIG. 11, a second embodiment of the metal clip 40' is shown wherein the vertical gap 45' is formed on the middle of the semi-conical portion 46' by bending the flat portion 44' from two lateral extensions thereof. Similarly, the pinching member 54 can also be formed in the same way.

Besides for the connection of a PGA type CPU chip to the circuit board, there is also provided a third embodiment of the metal clips 40' shown in FIGS. 12 and 13 for use in the instant connector to connect an SMT type CPU chip 96 (FIG. 13) to the circuit board. Since the SMT type CPU chip 96, instead of using upright straight pins 94, comprises L-shaped pins 98 which are not insertable into the metal clips of the present connector, an adaptor 80 which comprises upright straight pins to insert into the pinching member 54" of the metal clip 40" is used to connect the SMT type CPU 96 to the instant connector 10.

The L-shaped pins 98 of the SMT type CPU 96 are secured on the adaptor 80 by means of known surface mounting technique. The pins of the SMT type CPU 96 are then inserted into the pinching members 54" of the metal clips 40" disposed in the connector body 10 to complete the connection between the SMT type CPU 96 and the present connector 100.

Since the SMT type CPU 96 is surface-mounted to the pinching member 54" of the metal clip 40", the tapering formed on the lower end 60 of the first metal clip embodiment 40 is no longer useful and can be removed. Further, to help surface mounting the SMT type CPU 96 to the pinching member 54" of the metal clip 40", the height of the pinching member 54' can be slightly increased to partially project out of the connector body 10.

It is apparent that although the invention has been described in connection with a preferred embodiment, those skilled in the art may make changes to certain features of the preferred embodiment without departing from the spirit and scope of the invention as defined in the appended claims.

What is claimed is:

1. A connector for connecting a central processing unit chip to a computer circuit comprising a plurality of resilient conductive clips forcibly insertedly disposed within corresponding plurality of socket holes formed on a connector body thereof, wherein each of said socket holes comprises an upper section and a lower section connected together to form a through hole on said connector body, said upper section having a top opening located on a top surface of said connector body and a lower end having a cross-sectional shape and size substantially the same as said top opening and in communication with a top end of said lower section, said lower section further comprising a bottom opening formed on an under side of said connector body, the top end of said lower section being larger than the lower end of said upper section to define a shoulder therebetween, said lower section having a tapering inside surface gradually reduced from the bottom opening thereof, which is larger than the top end of the lower section, toward the top end thereof, and each of said resilient conductive clips comprising:

a base which is a length of hollow tubular member substantially complemental in shape to, but larger in cross-sectional size than the lower section of the socket hole to be forcibly inserted therein from the bottom opening of said lower section, an elongated vertical slot of a given width being formed thereon, extending along the length thereof, to allow said base to be deformed along a cross-sectional direction for insertion into the lower section of said socket hole;

an elongated flat peg which forms an integral extension from a lower end of said base; and a pinching member which is a length of hollow tubular member substantially in shape and size to the upper section of said socket hole to be loosely fit therein having a portion integrally connected to said base, said pinching member having a vertical slot extending along the length thereof, a step being formed between said base and said pinching member to abut against the shoulder formed between the lower section and the upper section of said socket hole.

2. A connector as claimed in claim 1 wherein each of said conductive clips is formed with a piece of metal plate.

3. A connector as claimed in claim 1 wherein the elongated peg extension of each of said conductive clips comprises a reinforcing rib extending along a portion of the length thereof.

4. A connector as claimed in claim 1 wherein the pinching member of each of said conductive members comprises an inward projection.

5. A connector as claimed in claim 1 wherein the base of each of said conductive clips comprises a plurality of sideways-projected paw members pointing downward to prevent the base from being disassembled therefrom.

6. A connector as claimed in claim 1 wherein the pinching member of each of said conductive clips comprises a tapering lower end with a plurality of vertical slits formed thereon extending from the lower end upward to a portion of the length thereof.

7. A connector as claimed in claim 2 wherein said piece of metal plate has at least a first lateral extension to be bent to form the base of said conductive clip with the vertical slot formed thereon and at least a second lateral extension to be bent to form the pinching member of said conductive clip with the vertical slot formed thereon.

8. A connector as claimed in claim 7 wherein the width of the vertical slot of said base is such to allow the base to be elastically deformed to insert into the lower section of said socket hole.

9. A connector as claimed in claim 1 wherein the pinching member comprises a portion projecting out of said socket hole from the top opening thereof.

* * * * *